US006906923B2

(12) United States Patent
Lofland et al.

(10) Patent No.: US 6,906,923 B2
(45) Date of Patent: Jun. 14, 2005

(54) HEAT SINK CLIP AND METHOD

(75) Inventors: Steven J. Lofland, Portland, OR (US); Willem M. Beltman, West Linn, OR (US)

(73) Assignee: Intel Corporation, Santa Clara, CA (US)

( * ) Notice: Subject to any disclaimer, the term of this patent is extended or adjusted under 35 U.S.C. 154(b) by 89 days.

(21) Appl. No.: 10/403,303

(22) Filed: Mar. 31, 2003

(65) Prior Publication Data

US 2004/0190258 A1 Sep. 30, 2004

(51) Int. Cl.[7] .................................................. H05K 7/20
(52) U.S. Cl. ...................... 361/704; 165/80.3; 165/185; 24/457; 248/510; 257/719; 361/707; 361/710
(58) Field of Search ................................ 165/80.3, 185; 24/296, 457–458, 625; 248/505, 510; 257/718–719, 726–727; 361/687, 704, 709, 710, 715, 719–721

(56) References Cited

U.S. PATENT DOCUMENTS

| 6,201,697 B1 | * | 3/2001 | McCullough | ............... 361/704 |
| 6,357,515 B1 | * | 3/2002 | Bhatia | ........................ 165/80.3 |
| 6,507,491 B1 | * | 1/2003 | Chen | ........................... 361/697 |

* cited by examiner

Primary Examiner—Gregory Thompson
(74) Attorney, Agent, or Firm—Schwegman, Lundberg, Woessner & Kluth, P.A.

(57) ABSTRACT

A heat sink clip that includes a base and a cam rotatably coupled to the base. The base includes a pair of side walls and a pin extending between the side walls such that the cam is rotatably mounted on the pin. When the clip is properly positioned relative to the heat sink and the electronic device, the cam rotates between at least one position where the cam does not compress the heat sink against the electronic device and another position where the cam does compress the heat sink against the electronic device.

36 Claims, 6 Drawing Sheets

HEAT SINK CLIP AND METHOD

TECHNICAL FIELD OF THE INVENTION

The present invention relates to a heat sink clip, a heat sink assembly and a method of assembling a heat sink to an electronic device. The invention particularly relates to a heat sink clip that compresses a heat sink against an electronic device.

BACKGROUND

Electronic devices generate heat during operation. Thermal management refers to the ability to keep temperature-sensitive elements in an electronic device within a prescribed operating temperature.

Historically, electronic devices have been cooled by natural convection. The cases or packaging of the devices included strategically located openings (e.g., slots) that allowed warm air to escape and cooler air to be drawn in.

The advent of high performance electronic devices, such as processors, now requires more innovative thermal management. Each increase in processing speed and power generally carries a "cost" of increased heat generation such that natural convection is no longer sufficient to provide proper thermal management.

One common method of cooling electronic devices includes thermally coupling a heat sink to the package of the electronic device. A typical heat sink includes protrusions, such as fins or pins, which project from a body of the heat sink. The protrusions give the heat sink a larger surface area such that the heat sink dissipates a greater amount of thermal energy from the package into the surrounding environment. Heat sinks are fabricated from materials with high thermal conductivity in order to efficiently transfer thermal energy from the electronic device package.

The heat sinks are typically mounted to the electronic devices by using adhesives, screws, and/or bolts. Another common method uses one or more clips to compress a heat sink against an electronic device. Compressing a heat sink against an electronic device typically reduces the thermal resistance between the heat sink and the electronic device. Clips that are able to generate a larger compressive force are particularly effective because a greater compressive force reduces the thermal resistance between the heat sink and the electronic device.

There is a need for a heat sink clip, heat sink assembly and method that securely attaches a heat sink to an electronic device using a large compressive force. The clips that are presently used to fasten heat sinks to electronic device packages are typically either (i) unable to generate a sufficient compressive force between the heat sink and the electronic device; or (ii) cumbersome to utilize when securing the heat sink to the electronic device.

DETAILED DESCRIPTION

The following detailed description of the invention references the accompanying drawings that show specific embodiments in which the invention may be practiced. Like numerals describe substantially similar components throughout each of the several views that make up the drawing. Other embodiments may be used, and structural, logical, and electrical changes made, without departing from the scope of the present invention.

The heat sink clip, heat sink assembly, computer system and method described herein restrain a heat sink from moving relative to an electronic device as the heat sink conducts thermal energy from the electronic device. The heat sink clip and method apply a large compressive force between the heat sink and the electronic device. Maintaining the proper position of the heat sink relative to the electronic device and applying a large compressive force between the heat sink and the electronic device promote thermal conductivity between the heat sink and the electronic device. In addition, the clip securely attaches the heat sink such that the heat sink assembly is able to withstand any shock and/or vibration loads that may applied to a computer system that includes the heat sink assembly.

FIGS. 1–6 illustrate a heat sink clip 10 that may be used to secure a heat sink to an electronic device. Heat sink clip 10 includes a base 12 and a cam 14 rotatably coupled to base 12.

Base 12 includes a pair of side walls 16A, 16B and a pin 18 extending between the side walls 16A, 16B. Cam 14 is rotatably mounted on pin 18. When the clip 10 is properly positioned relative to a heat sink and an electronic device, cam 14 rotates between at least one position where cam 14 does not compress the heat sink against the electronic device (see, e.g., FIGS. 1 and 2), and another position where cam 14 does compress the heat sink against the electronic device (see, e.g., FIGS. 3–4 and 5–6).

An arm 20 projects from cam 14 such that cam 14 is rotated by applying a force to arm 20. Cam 14 also includes a lobe 22 that engages the heat sink to generate a compressive force between the heat sink and the electronic device when clip 10 is properly positioned relative to the heat sink and the electronic device.

In the illustrated sample embodiments, lobe 22 is on one side of cam 14 and arm 20 projects from an opposing side of cam 14. Arm 20 includes a first section 24 that projects from cam 14 and a second section 26 that is attached to first section 24 at an angle A (see FIG. 2) relative to first section 24. Angle A may be between 90 and 180 degrees in some embodiments.

Base 12 may include a top wall 30 that extends between side walls 16A, 16B. In some sample embodiments, top wall 30 is in a portion of a travel path of arm 20 as cam 14 is rotated.

In the illustrated example embodiment, top wall 30 includes flexible end portions 32A, 32B. A first fastening element, such as loop 34, is on one of the flexible end portions 32A. A second fastening element, such as loop 36, is on the other flexible end portion 32B. In the illustrated example embodiments, loop 36 is formed by a pair of overlapping members 37A, 37B. One of the overlapping members 37A extends from flexible end portion 32B, and a lever 38 extends from the other overlapping member 37B. Applying a force to the lever 38 maneuvers the loop 36 that is formed by overlapping members 37A, 37B. As an example, a force may be applied to lever 38 to disengage loop 36 when clip 10 needs to be removed.

Side wall 16B on clip 10 includes a transverse edge 28 that is adapted to engage a heat sink when clip 10 is properly positioned relative to the heat sink and an electronic device that is compressed against the heat sink by clip 10. Transverse edge 28 may extend along a single portion, multiple portions (as shown in FIGS. 1, 2, 4, 6) or all of side wall 16B.

Figure 2:
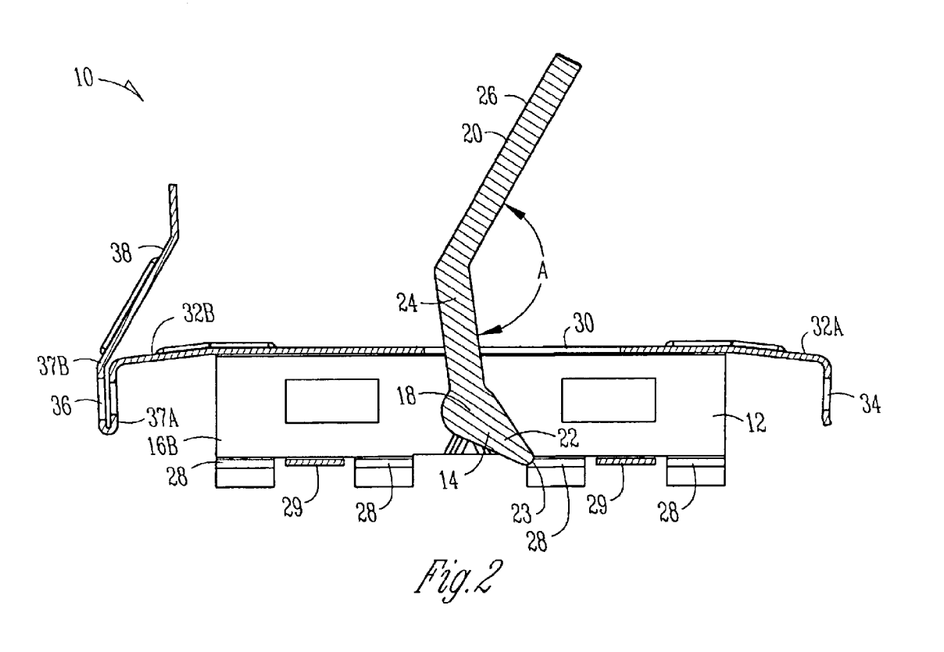
FIG. 2 is a cross-section view of the heat sink clip shown in FIG. 1.
Figure 4:
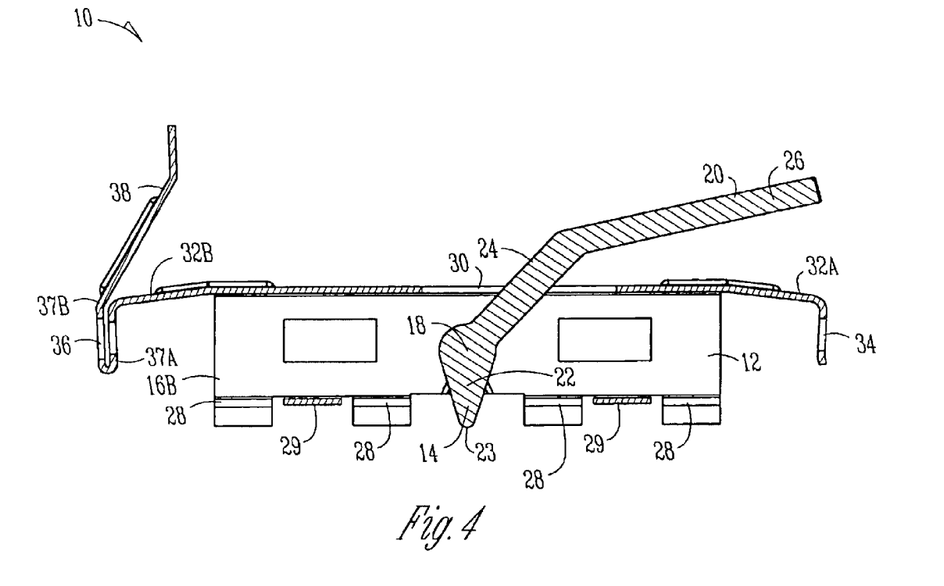
FIG. 4 is a cross-section view of the heat sink clip shown in FIG. 3.
Figure 6:
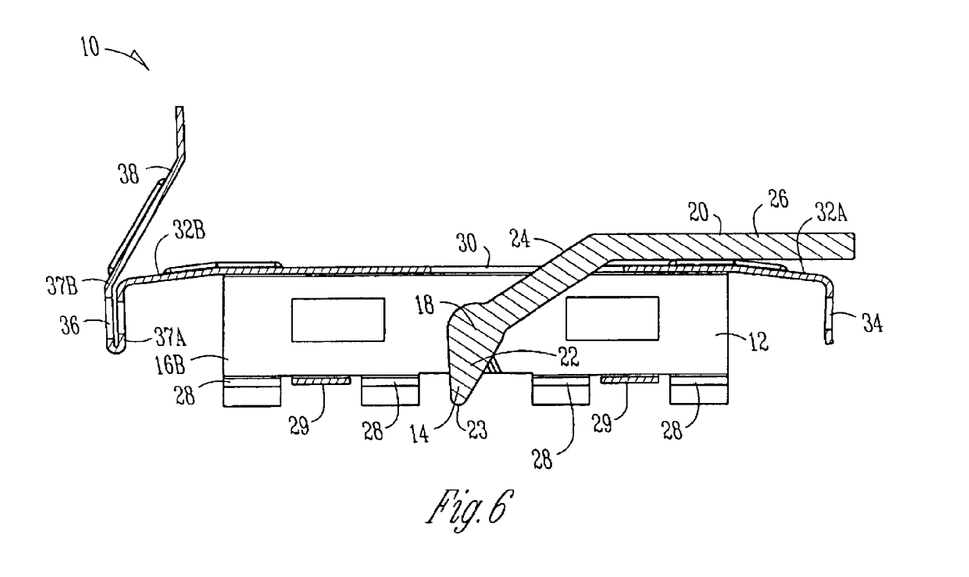
FIG. 6 is a cross-section view of the heat sink clip shown in FIG. 5.

Side wall 16A on clip 10 also includes a transverse edge 29 that is adapted to engage a heat sink when clip 10 is properly positioned relative to the heat sink. Transverse edge 29 may extend along a single portion, multiple portions (as shown in FIGS. 2, 4, 6) or all of side wall 16A. In other embodiments, only one of the side walls 16A, 16B may include a transverse edge that is adapted to engage the heat sink.

In the illustrated example embodiment, a fastening element, such as loop 40, may be part of at least one of the side walls 16A, 16B (shown as part of side wall 16A in FIGS. 1–7). Side walls 16A, 16B may include any number, size and style of fastening elements that are adapted to secure clip 10 to a heat sink and/or electronic device.

Figure 7:
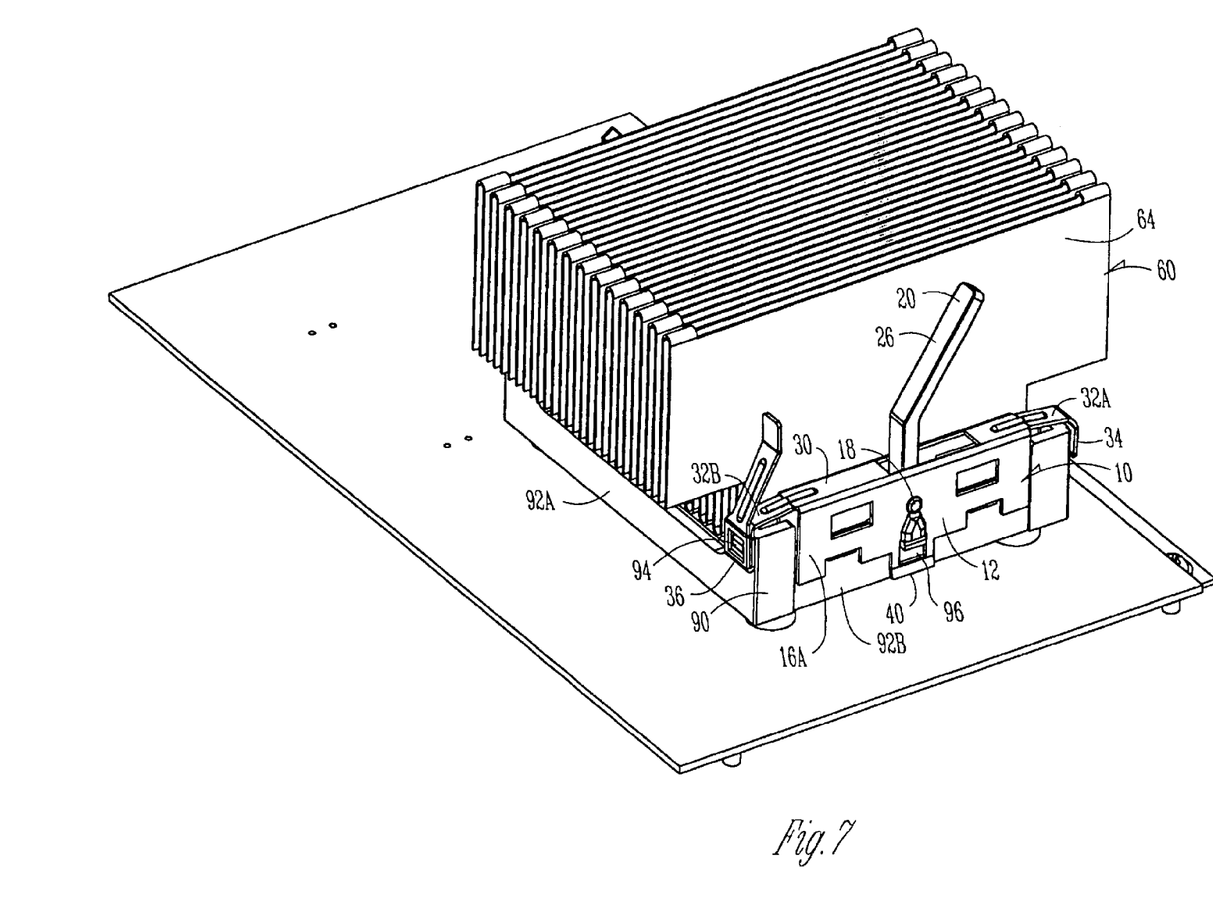
FIG. 7 is a perspective view of an assembled heat sink assembly that includes the heat sink clip shown in FIGS. 1–6.

FIG. 7 illustrates a heat sink assembly 60. Heat sink assembly 60 includes a heat sink 64, an electronic device 70 (hidden under heat sink 64 in FIG. 7) and a clip 10. Heat sink assembly 60 may further include a socket 90 such that clip 10 is secured to socket 90 to compress heat sink 64 against electronic device 70. The force generated by clip 10 on heat sink 64 and electronic device 70 reduces the thermal resistance between heat sink 64 and electronic device 70 and keeps heat sink 64 from moving relative to electronic device 70 when heat sink assembly 60 is subjected to shock and/or vibration.

Figure 8:
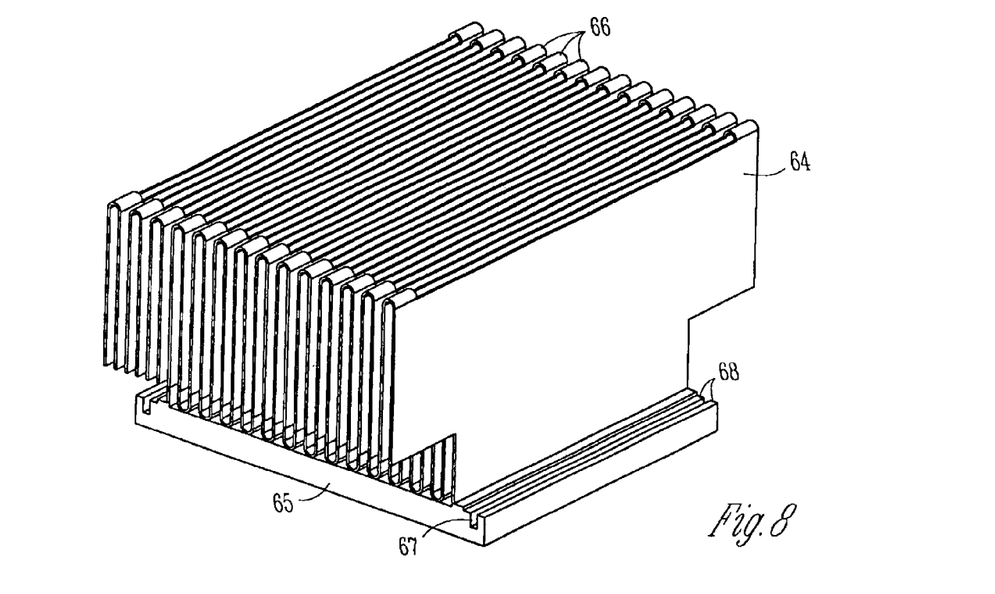
FIG. 8 is a perspective view of a heat sink that is used in the heat sink assembly shown in FIG. 7.

Referring now also to FIG. 8, heat sink 64 includes a base 65 and protrusions 66 that project from the base 65. In an example embodiment, protrusions 66 are parallel, elongated fins. A thermally conductive material, such as grease, soft metallic foil, or metal-impregnated paste, may be placed between electronic device 70 and heat sink 64 to further minimize thermal resistance. Heat sink 64 can have any configuration because the design of heat sink 64 is determined by the thermal dissipation needs of electrical device 70 and the surrounding environment.

Heat sink 64 is preferably made from a material having good thermal conductivity such that heat sink 64 efficiently conducts thermal energy from electronic device 70. The thermal energy is conducted from electronic device 70 through the base 65 of heat sink 64 to protrusions 66. The large surface area of the numerous protrusions 66 facilitates transferring the thermal energy from heat sink 64 to the surrounding environment.

Figure 10:
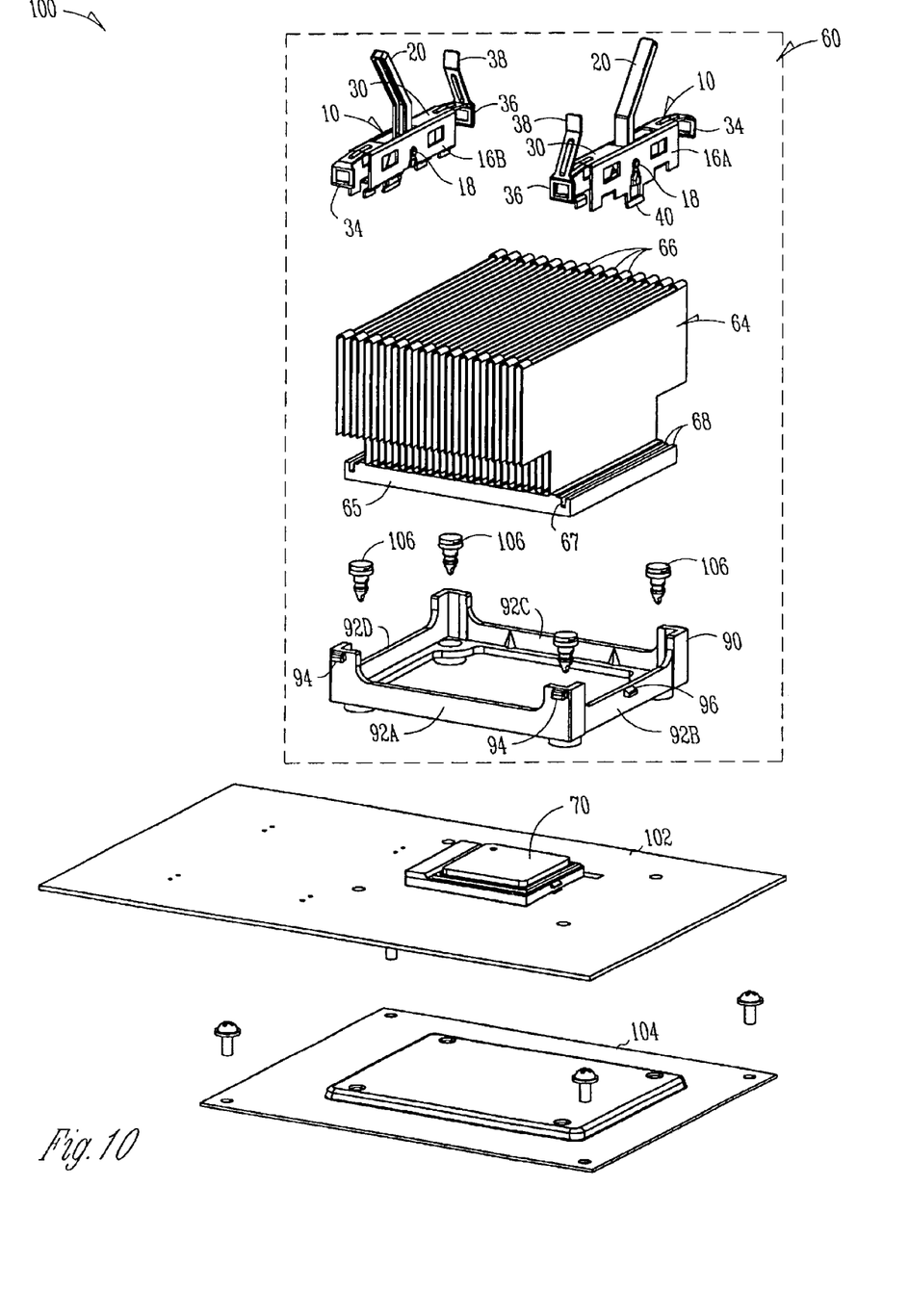
FIG. 10 is an exploded perspective view of a portion of a computer system that includes two heat sink clips.

In the illustrated sample embodiment, heat sink 64 includes a groove 67 (or grooves) such that side wall 16B on clip 10 is inserted into groove 67 as clip 10 is assembled to heat sink 64 (shown most clearly in FIGS. 7 and 10). Clip 10 is inserted into groove 67 until transverse edges 28, 29 on side walls 16A, 16B engage an upper surface 68 of heat sink 64.

Figure 9:
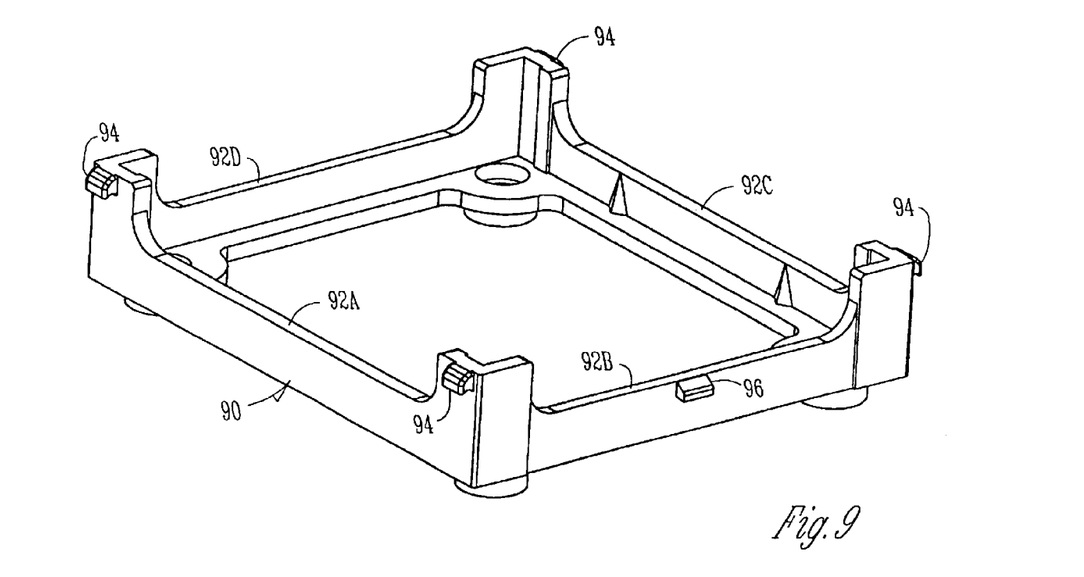
FIG. 9 is a perspective view of a socket that is used in the heat sink assembly shown in FIG. 7.

Referring now also to FIG. 9, socket 90 engages at least one fastening element on clip 10 when clip 10 is secured to socket 90. In the illustrated sample embodiments, socket 90 includes supports 92A, 92B, 92C, 92D that surround heat sink 64. The supports 92A, 92C on opposing sides of socket 90 include tabs 94. The loops 34, 36 on the flexible end portions 32A, 32B of clip 10 engage tabs 94 on socket 90 to secure clip 10 to socket 90.

Support 92B on socket 90 may also include a tab 96 that engages loop 40 on side wall 16A to further secure clip 10 to socket 90. The relative locations of tabs 94, 96 on socket 90, loops 34, 36, 40 on clip 10 and upper surface 68 on heat sink 64 cause clip 10 to apply a compressive force to heat sink 64 when clip 10 is secured to socket 90 and lever 20 is rotated.

In some sample embodiments, when clip 10 is inserted into groove 67 on heat sink 64 with loops 34, 36 hooked onto tabs 94, clip 10 does not apply any force to heat sink 64. Only when the lever 20 is rotated past the point where cam 23 engages the upper surface 68 of heat sink 64 is a force applied to heat sink 64.

Although socket 90 includes tabs 94, 96 that engage the loops 34, 36, 40 on clip 10, socket 90 may include other attachment structures depending on the type of clip that is used to compress heat sink 64 against electronic device 70. The arrangement, location, number and type of fastening elements between clip 10 and socket 90 will often depend on such factors as the type of heat sink, the space available for the heat sink assembly and the cooling requirements of the heat sink assembly (among other factors).

Figure 1:
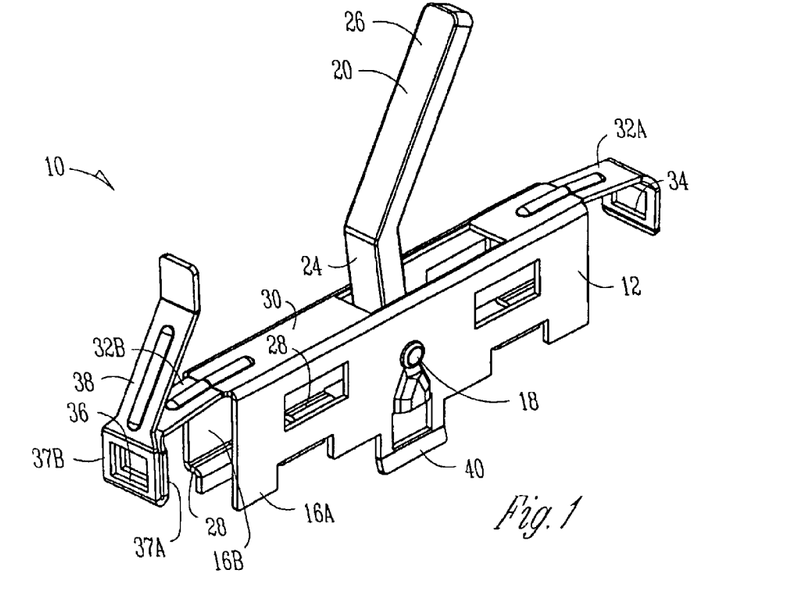
FIG. 1 is a perspective view of a heat sink clip with a cam in the clip positioned such that the cam would not apply a compressive force.
Figure 3:
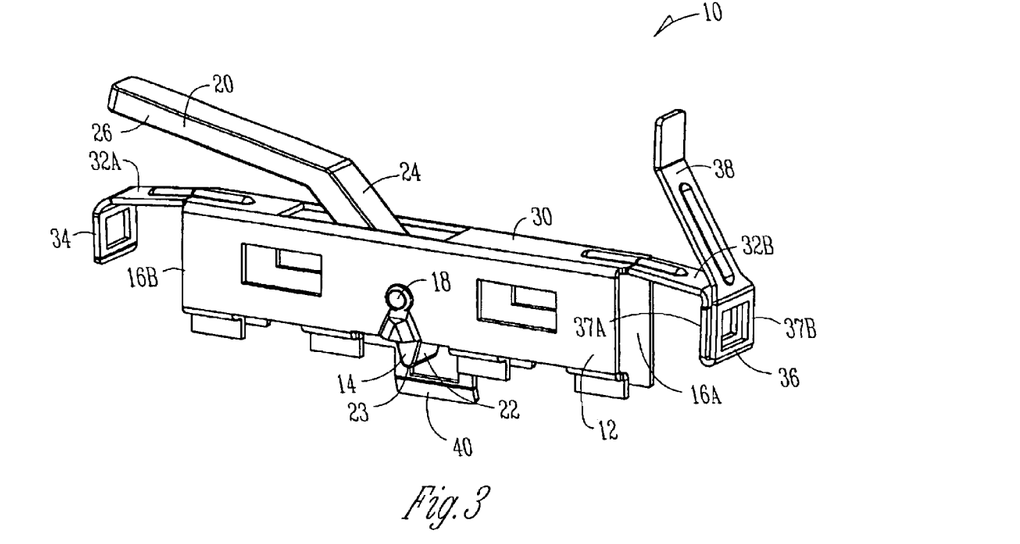
FIG. 3 is a perspective view of the heat sink clip shown in FIG. 1 with the cam in the clip positioned such that the cam would apply a maximum compressive force.

Once clip 10 is assembled to socket 90 and heat sink 64, a significantly greater force is applied to heat sink 64 by rotating arm 20 to engage the lobe 22 on cam 14 with the upper surface 68 of heat sink 64 (see FIGS. 1–2). Continued rotation of arm 20 increases the compressive force applied by lobe 22 against heat sink 64. The force generated on heat sink 64 increases until a tip 23 of lobe 22 engages the upper surface 68 of heat sink 64 (FIGS. 3–4 and 7 illustrate cam 14 in this position) at which point the maximum compressive force is being applied by cam 14 to heat sink 64.

Figure 5:
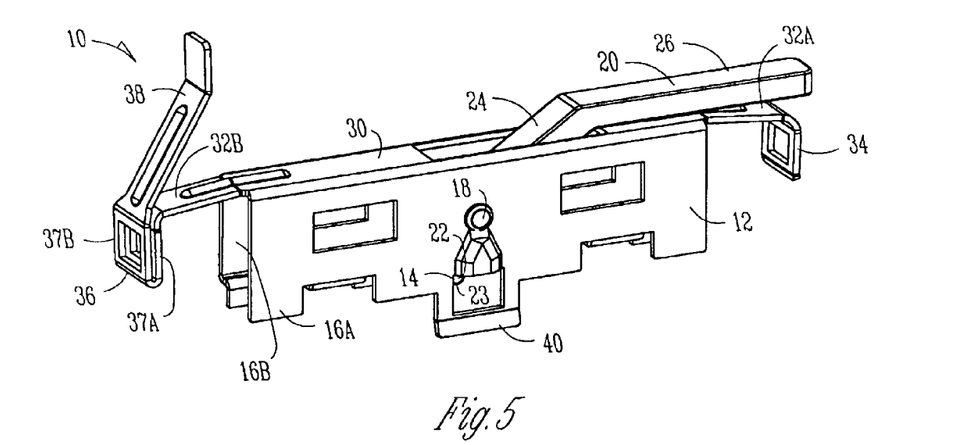
FIG. 5 is a perspective view of the heat sink clip shown in FIG. 1 illustrating where the cam in the clip is positioned when the clip is installed.

As shown in FIGS. 5–6 and 10, arm 20 is further rotated until the second section 26 of arm 20 engages the top wall 30 of base 12. Top wall 30 prevents further rotation of arm 20 such that lobe 22 applies a constant compressive force to heat sink 64. The constant compressive force serves to adequately secure the heat sink 64 to electronic device 70, especially when heat sink assembly 60 is subjected to shock and/or vibration loading. In addition, the constant compressive force also reduces the thermal resistance between heat sink 64 and electronic device 70.

A method of securing a heat sink 64 to an electronic device 70 will now be described with reference to FIGS. 1–9. The method includes positioning a heat sink 64 in thermal contact with an electronic device 70; engaging a clip 10 with at least one of the heat sink 64 and the electronic device 70; and rotating a cam 14 on clip 10 to compress heat sink 64 against electronic device 70.

Rotating cam 14 on clip 10 may include rotating cam 14 between one position where cam 14 does not compress heat sink 64 against electronic device 70 (see, e.g., FIGS. 1–2), and another position where cam 14 compresses heat sink 64 against electronic device 70 (see, e.g., FIGS. 3–6). In addition, rotating cam 14 on clip 10 may include applying a force to an arm 20 that projects from cam 14. The method may also include preventing further rotation of cam 14 by engaging arm 20 with a top wall 30 of a base 12 that rotatably supports cam 14.

In some sample embodiments, engaging clip 10 with at least one of the heat sink 64 and electronic device 70 includes (i) placing a side wall 16B of a base 12 on clip 10 into a groove 67 on heat sink 64; (ii) engaging transverse edges 28, 29 on side walls 16A, 16B of base 12 with an upper surface 68 of heat sink 64; and/or (iii) securing clip 10 to a socket 90 that surrounds electronic device 70.

FIG. 10 illustrates a computer system 100 that includes heat sink assembly 60. It should be noted that heat sink assembly 60 might be incorporated into any type of computer system. Computer system 100 includes a substrate, such as printed circuit board 102, which is coupled to a chassis 104. Socket 90 is mounted onto printed circuit board 102, such as by using fasteners 106. Electronic device 70 is placed within socket 90 and may be mechanically and/or electrically connected to socket 90.

In the example embodiment illustrated in FIG. 10, heat sink assembly 60 includes two clips 10 that are mounted on opposing sides of heat sink 64. Clips 10 compress the heat sink 64 against electronic device 70 to reduce the thermal resistance between heat sink 64 and electronic device 70. As discussed above with regard to FIGS. 1–7, an even greater compressive force is applied to heat sink 64 by rotating the arms 20 on each cam 14. The arms 20 are rotated until the tips 23 on each lobe 22 pass by heat sink 64 and the second sections 26 of each arm 20 are prevented from further rotation by the respective top walls 30 of bases 12.

In other example embodiments, one or more additional clips may engage the heat sink, socket and/or electronic device. The clip(s) could also engage the protrusions on the heat sink to prevent movement of the heat sink. In addition, a single clip may be used to compress multiple heat sinks against an electronic device.

The heat sink clip, heat sink assembly, computer system and method described above provide a thermal solution for high heat generating electronic devices. Many other embodiments will be apparent to those of skill in the art from the above description. The scope of the invention should be determined with reference to the appended claims along with the full scope of equivalents to which such claims are entitled.

What is claimed is:

1. A heat sink clip to secure a heat sink to an electronic device, the heat sink clip comprising:
   a base adapted to engage at least one of the heat sink and the electronic device, the base including a pair of side walls, a top wall extending between the pair of side walls and a pin extending between the side walls; and
   a cam rotatably mounted on the pin such that rotating the cam compresses the heat sink against the electronic device, an arm projecting from the cam such that the cam is rotated by applying a force to the arm, the top wall of the base obstructing a travel path of the arm as the cam is rotated.

2. The heat sink clip of claim 1, wherein the cam includes a lobe that engages the heat sink to generate a compressive force between the heat sink and the electronic device.

3. The heat sink clip of claim 2, wherein the lobe is on one side of the cam and the arm projects from an opposing side of the cam.

4. A heat sink clip to secure a heat sink to an electronic device, the heat sink clip comprising:
   a base adapted to engage at least one of the heat sink and the electronic device, the base including a pair of side walls and a pin extending between the side walls, at least one of the side walls including a transverse edge that engages the heat sink; and
   a cam rotatably mounted on the pin such that rotating the cam compresses the heat sink against the electronic device.

5. The heat sink clip of claim 4, wherein the earn is movable between one position where the cam does not compress the heat sink against the electronic device and another position where the cam does compress the heat sink against the electronic device.

6. The heat sink clip of claim 4, wherein an arm projects from the cam such that the cam is rotated by applying a force to the arm, the arm including a first section that projects from the cam and a second section that is attached to the first section at an angle between 90 and 180 degrees relative the first section.

7. A heat sink clip to secure a heat sink to an electronic device, the heat sink clip comprising:
   a base adapted to engage at least one of the heat sink and the electronic device, the base including a top wall having a pair of flexible end portions and a first fastening element attached to one of the flexible end portions, the first fastening element being a loop; and
   a cam rotatably coupled to the base such that rotating the cam compresses the heat sink against the electronic device.

8. The heat sink clip of claim 7, wherein the base includes a second fastening element attached to the other of the flexible end portions.

9. The heat sink clip of claim 8, wherein the second fastening element includes a pair of overlapping members that form a loop, one of the overlapping members extending from the other of the flexible end portions and a lever extending from the other overlapping member such that applying a force to the lever maneuvers the loop formed by the overlapping members.

10. A heat sink clip to secure a heat sink to an electronic device, the heat sink clip comprising:
    a base adapted to engage at least one of the heat sink and the electronic device, the base including a pair of side walls, a pin extending between the side walls and a fastening element on at least one of the side walls; and
    a cam rotatably coupled to the base such that rotating the cam compresses the heat sink against the electronic device.

11. The heat sink clip of claim 10, wherein the cam is rotatably mounted on the pin.

12. The heat sink clip of claim 11, wherein an arm projects from the cam such that the cam is rotated by applying a force to the arm.

13. A method of securing a heat sink to an electronic device, the method comprising:
    positioning the heat sink in thermal contact with the electronic device;
    engaging a clip with at least one of the heat sink and the electronic device;
    rotating a cam on the clip to compress the heat sink against the electronic device; and
    preventing further rotation of the cam such that the cam continuously compresses the heat sink against the electronic device by engaging an arm that projects from the cam with a base that rotatably supports the cam.

14. The method of claim 13, wherein rotating a cam on the clip includes applying a force to an arm projecting from the cam.

15. The method of claim 13, wherein rotating a cam on the clip includes rotating the cam between one position where the cam does not compress the heat sink against the electronic device and another position where the cam compresses the heat sink against the electronic device.

16. A method of securing a heat sink to an electronic device, the method comprising:
    positioning the heat sink in thermal contact with the electronic device;
    engaging a base of a clip with the heat sink such that a transverse edge on a side wall of the base engages an upper surface of the heat sink; and
    rotating a cam on the clip to compress the heat sink against the electronic device.

17. The method of claim 16, further comprising preventing further rotation of the cam such that the cam continuously compresses the heat sink against the electronic device.

18. The method of claim 16, wherein engaging the clip with the heat sink includes placing the side wall on the base of the clip into a groove on the heat sink.

19. A method of securing a heat sink to an electronic device, the method comprising:
    positioning the heat sink in thermal contact with the electronic device;
    engaging a clip with at least one of the heat sink and the electronic device by securing the clip to a socket that surrounds the electronic device, wherein securing the clip to the socket includes fastening loops on the clip to tabs on the socket; and
    rotating a cam on the clip to compress the heat sink against the electronic device.

20. The method of claim 19, wherein rotating a cam on the clip includes applying a force to an arm projecting from the cam.

21. The method of claim 19, wherein rotating a cam on the clip includes rotating the cam between one position where the cam does not compress the heat sink against the electronic device and another position where the cam compresses the heat sink against the electronic device.

22. A heat sink assembly to extract thermal energy from an electronic device, the heat sink assembly comprising:
    a heat sink that includes an upper surface; and
    a clip including a base and a cam rotatably coupled to the base such that rotating the cam compresses the heat sink against the electronic device, the base including a pair of side walls such that at least one of the side walls on the base includes a transverse edge that engages the upper surface of the heat sink.

23. The heat sink assembly of claim 22, wherein the heat sink includes a groove such that at least one of the side walls on the base is inserted into the groove in the heat sink.

24. The heat sink assembly of claim 22, wherein the cam includes a lobe that engages the heat sink to compress the heat sink against the electronic device.

25. A heat sink assembly to extract thermal energy from an electronic device, the heat sink assembly comprising:
    a heat sink;
    a clip including a base and a cam rotatably coupled to the base such that rotating the cam compresses the heat sink against the electronic device, the clip including a fastening element having a loop; and
    a socket that includes a tab which engages the loop on the clip to secure the clip to the socket.

26. The heat sink assembly of claim 25, wherein the cam includes a lobe that engages the heat sink to compress the heat sink against the electronic device.

27. The heat sink assembly of claim 25, wherein the clip includes a plurality of fastening elements that each include a loop and the socket includes a plurality of tabs such that each tab engages one of the loops on the clip to secure the clip to the socket.

28. A heat sink assembly to extract thermal energy from an electronic device, the heat sink assembly comprising:
    a heat sink;
    a clip including a base having a pair of sidewalls and a cam rotatably coupled to the base such that rotating the cam compresses the heat sink against the electronic device, wherein at least one the sidewalls includes a fastening element; and
    a socket that engages the fastening element to secure the clip to the socket.

29. The heat sink assembly of claim 28, wherein the socket includes a tab and the fastening element includes a loop such that the tab on the socket engages the loop on the clip to secure the clip to the socket.

30. The heat sink assembly of claim 28, wherein the cam includes a lobe that engages the heat sink to compress the heat sink against the electronic device.

31. A computer system comprising:
    a chassis;
    a substrate mounted on the chassis;
    an electronic device coupled to the substrate;
    a heat sink; and
    a clip including a base having a pair of side walls, a top wall extending between the side walls and a pin extending between the side walls, the clip further including a cam rotatably mounted on the pin such that rotating the cam compresses the heat sink against the electronic device, an arm projecting from the cam such that the cam is rotated by applying a force to the arm, the top wall of the base obstructing a travel path of the arm as the cam is rotated.

32. The computer system of claim 31, wherein the substrate is a printed circuit board.

33. The computer system of claim 31, further comprising a socket mounted on the substrate, the socket engaging the clip to secure the clip to the heat sink.

34. A computer system comprising:
    a chassis;
    a substrate mounted on the chassis;
    an electronic device coupled to the substrate;
    a heat sink; and
    a clip including a base adapted to engage at least one of the heat sink and the electronic device, the base including a pair of side walls, a fastening element on at least one of the side walls and a pin extending between the side walls, the clip further including a cam rotatably coupled to the base such that rotating the cam compresses the heat sink against the electronic device.

35. The heat sink clip of claim 34, wherein the cam is rotatably mounted on the pin.

36. The computer system of claim 34, further comprising a socket mounted on the substrate, the socket engaging the clip to secure the clip to the heat sink.

* * * * *